(12) United States Patent
Bhat et al.

(10) Patent No.: US 8,217,498 B2
(45) Date of Patent: Jul. 10, 2012

(54) GALLIUM NITRIDE SEMICONDUCTOR DEVICE ON SOI AND PROCESS FOR MAKING SAME

(75) Inventors: Rajaram Bhat, Painted Post, NY (US); Kishor Purushottam Gadkaree, Big Flats, NY (US); Jerome Napierala, Painted Post, NY (US); Linda Ruth Pinckney, Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 1009 days.

(21) Appl. No.: 11/975,289

(22) Filed: Oct. 18, 2007

(65) Prior Publication Data

US 2009/0101924 A1    Apr. 23, 2009

(51) Int. Cl.
*H01L 21/36* (2006.01)

(52) U.S. Cl. . 257/615; 257/347; 257/352; 257/E21.098; 438/455

(58) Field of Classification Search ............ 257/79–103, 257/9–39, 613–616, E21.098; 438/455–459, 438/478–509; 117/1, 11–109
See application file for complete search history.

(56) References Cited

U.S. PATENT DOCUMENTS

| | | | |
|---|---|---|---|
| 5,306,662 A | 4/1994 | Nakamura et al. | 21/203 |
| 6,210,479 B1 | 4/2001 | Bojarczuk et al. | 25/2 |
| 6,646,292 B2 * | 11/2003 | Steigerwald et al. | 257/103 |
| 6,982,435 B2 * | 1/2006 | Shibata et al. | 257/76 |
| 7,141,449 B2 | 11/2006 | Shiozaki | |
| 7,176,528 B2 | 2/2007 | Couillard et al. | 257/347 |
| 7,205,220 B2 | 4/2007 | Nakamura et al. | |
| 7,452,785 B2 * | 11/2008 | Kononchuk et al. | 438/455 |
| 2001/0000916 A1 * | 5/2001 | Kadota | 257/43 |
| 2004/0009649 A1 * | 1/2004 | Kub et al. | 438/459 |
| 2005/0124161 A1 * | 6/2005 | Rawdanowicz et al. | 438/689 |
| 2006/0174815 A1 | 8/2006 | Butcher et al. | 21/322 |
| 2006/0234477 A1 * | 10/2006 | Gadkaree | 438/478 |
| 2006/0284167 A1 * | 12/2006 | Augustine et al. | 257/40 |
| 2007/0117354 A1 * | 5/2007 | Gadkaree et al. | 438/478 |
| 2007/0278574 A1 * | 12/2007 | Hsu et al. | 257/347 |

FOREIGN PATENT DOCUMENTS

| | | |
|---|---|---|
| WO | 02/48434 | 6/2002 |
| WO | 2006/034540 | 4/2006 |

OTHER PUBLICATIONS

Singhal et al., www.sciencedirect.com and Microelectronics Reliability vol. 46—"Reliability of Large Periphery GaN-on-Si HFETs", 2006, pp. 1247-1253.
Los Alamos National Laboratory News, "New Gallium Nitride Film Method Beats the Heat", printed on Sep. 19, 2007.
Gail Robinson, EETimes.com—"Gallium Nitride Nears Use in RF Semiconductors", printed on Sep. 18, 2007.
"Bluglass Technology" from www.bluglass.com.au, printed on Oct. 10, 2007.
Hsu et al., Journal of the Electrochemical Society vol. 154—"Crack-Free High-Brightness InGaN/GaN LEDs on Si(III) with Initial AlGaN Buffer and Two LT-Al Interlayers", 2007, pp. 191-193.
Dadgar et al., Advanced LEDs for Solid State Lighting—"Epitaxy of GaN LEDs on Large Substrates: Si or Sapphire?", 2006.
Q. Lou, et al., "Laser Applications of Transparent Polycrystalline Ceramic", Advances in Ceramics—Synthesis and Characterization, Processing and Specific Applications, Shanghai Institute of Optics and Fine Mechanics, pp. 447-477.

* cited by examiner

*Primary Examiner* — Kiesha Bryant
*Assistant Examiner* — Eric Ward
(74) *Attorney, Agent, or Firm* — Bruce P. Watson (57) ABSTRACT

Methods and apparatus for producing a gallium nitride semiconductor on insulator structure include: bonding a single crystal silicon layer to a transparent substrate; and growing a single crystal gallium nitride layer on the single crystal silicon layer.

9 Claims, 5 Drawing Sheets

GALLIUM NITRIDE SEMICONDUCTOR DEVICE ON SOI AND PROCESS FOR MAKING SAME

BACKGROUND

The present invention relates to the manufacture of a semiconductor device having a gallium nitride layer on a semiconductor-on-insulator (SOI) structure.

Gallium nitride is a material widely used in the construction of blue, violet and white light emitting diodes, blue laser diodes, ultraviolet detectors and high power microwave transistor devices.

Conventional gallium nitride device technology is based on single crystal material grown at temperatures generally above 950° C. directly on sapphire or silicon carbide substrates. The growing processes are typically metal organic chemical vapor deposition (MOCVD) or molecular beam epitaxy (MBE) techniques. These processes are normally run under conditions which are as near as possible to stoichiometry. Although GaN made using the aforementioned conventional processes includes a large number of defects, it has been considered by some to be single crystal material. The inclusion of a large number of defects, however, may have significant impact on the performance of a semiconductor device formed on or in connection with the gallium nitride material—which is not a characteristic of a low defect, single crystal material.

The prior art, such as U.S. Patent Publication No. 2006/0174815 describes substrates made of sapphire or silicon carbide (on which the GaN is directly disposed) as being expensive and small in size and the application of such devices as being impractical or otherwise of limited value. The prior art has also recognized that that growth of gallium nitride on such substrates requires strategies that reduce defects generated by the mismatch in atomic spacing between the substrate and the gallium nitride. Buffer layers may be used to reduce mismatch-induced defects. Greater reduction in defect formation may be achieved using epitaxial lateral overgrowth (ELOG), although the prior art has criticized this technique as being more expensive.

The prior art has also criticized the growth of gallium nitride on substrates at high temperatures, as such is thought to entail a large expenditure in temperature resistant growth equipment and ancillaries. Thus, for example, U.S. 2006/0174815 discusses the disadvantages of the aforementioned process for the production of gallium nitride above 950° C., which it says results in high energy losses and requires the use of special materials. Another disclosed disadvantage is that the substrates used at these high temperatures are not matched to GaN and, thus, expensive methodologies must be applied to overcome the mismatch in atomic spacing.

Other substrate materials, such as ZnO, have only been accessible at lower temperatures. U.S. 2006/0174815 discusses the advantage(s) of growth using lower temperatures, e.g., below 650° C., on less expensive, but temperature sensitive, substrate materials such as silicon, glass or quartz. Growth of gallium nitride on a buffer layer of ZnO has been identified as being advantageous since it is more closely lattice matched to GaN at temperatures below 650° C.

It has also been recognized that GaN material grown at low temperatures is of lower quality because polycrystalline material is prevalent. Blue LED fabricated from polycrystalline GaN grown on quartz using a GaN buffer layer has been demonstrated; however, interest in polycrystalline GaN has been low in comparison to that of single crystal material.

Against this backdrop, for general illumination, large area light sources may be achieved using a large number of LEDs, grown on small diameter substrates, which are then mounted on a large panel. One existing approach, by BluGlass Limited of Silverwater Australia, advocates producing GaN at temperatures "significantly lower" than the 1000° C., which they describe as typical of current processes of growing GaN directly on sapphire. The BluGlass process entails growth of the GaN directly on glass using low temperatures (i.e., significantly lower than 1000° C.). This approach, however, results in amorphous or very fine grained polycrystalline GaN, which leads to LEDs with poor efficiency. In addition, the glass used in this process cannot withstand high temperatures, thus limiting the deposition temperature of GaN, which again leads to poor quality material and poor LED performance.

Accordingly, there is a need in the art for a new structures and/or processes for forming GaN LEDs, which are capable of high efficiency performance and/or large area LEDs, which, are cost-effective to produce commercially viable products.

SUMMARY

In accordance with one or more embodiments of the present invention, an apparatus includes: a transparent substrate; a single crystal silicon layer bonded to the transparent substrate; and a single crystal gallium nitride layer grown on the single crystal silicon layer.

In accordance with one or more further embodiments of the present invention, an LED structure includes: a transparent substrate; a single crystal silicon layer bonded to the transparent substrate; and a single crystal gallium nitride layer grown on the single crystal silicon layer, wherein the gallium nitride layer includes an n-doped layer and a p-doped layer forming an LED.

The transparent substrate and the single crystal silicon layer bonded thereto are capable of withstanding a processing temperature of about 750° C. or higher for growing the single crystal gallium nitride layer on the single crystal silicon layer. The processing temperature may also be about 1000° C. or higher.

The single crystal silicon layer is of a (1 1 1) orientation. The single crystal silicon layer may be about 1-130 nm thick. The single crystal silicon layer may be formed from separate tiles having seams therebetween in which single crystal gallium nitride has grown.

The transparent substrate is formed from a material selected from the group consisting of: glass, glass-ceramic, and transparent ceramics including aluminum oxynitride, magnesium aluminate spinel, yttrium aluminate garnet, polycrystalline alumina, and sapphire.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION

Figure 1:
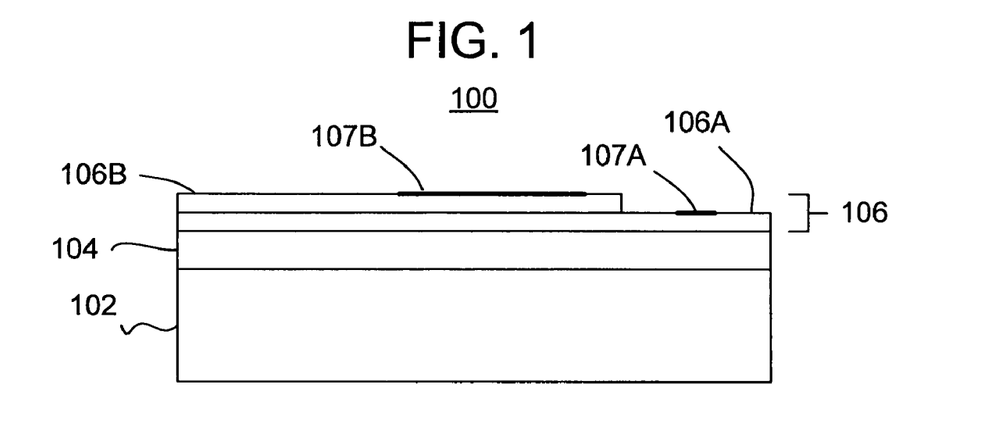
FIG. 1 is a block diagram illustrating the structure of a gallium nitride based LED device in accordance with one or more embodiments of the present invention.

With reference to the drawings, wherein like numerals indicate like elements, there is shown in FIG. 1 an LED structure 100, suitable for use in small area or large area fabrication. The LED structure 100 includes a transparent substrate 102, a single crystal silicon layer 104 bonded to the transparent substrate 102, and a single crystal gallium nitride (GaN) layer 106 grown on the single crystal silicon layer 104. Although the GaN layer 106 may take on any of the known configurations for forming an LED, the illustrated structure includes an n-doped layer 106A and a p-doped layer 106B forming an active portion of the LED structure 100. Electrodes 107A and 107B are used to apply the voltage potential and current necessary to produce LED illumination. Those skilled in the art understand that the description of the above structure has been simplified for brevity. A GaN LED structure includes more than n-doped and p-doped regions of GaN; for example, the active region may include either an MQW or DH (double heterostructure) consisting of GaN/GaN between the n-doped layer 106A and the p-doped layer 106B.

The semiconductor structure, which in this embodiment is the LED structure 100, is essentially a semiconductor-on-insulator structure. To date, the semiconductor material most commonly used in semiconductor-on-insulator structures has been silicon. Such structures have been referred to in the literature as silicon-on-insulator structures, or more generally semiconductor-on-insulator structures and the abbreviation "SOI" has been applied to such structures. A more specific type of SOI is a semiconductor-on-glass (SOG) structure, such as a silicon on glass configuration.

As will be discussed in more detail below, the growth of the single crystal gallium nitride (GaN) layer 106 on the single crystal silicon layer 104 is at a relatively high temperature in order to minimize defects in the GaN layer 106 and insure that the formation of substantially single-crystal material is obtained. Thus, the GaN growth process onto the single crystal silicon layer 104 should be carried out at about 750° C. or higher, more particularly about 1000° C. or higher.

The term "substantially" single-crystal is used in describing the GaN layer 106 (and/or the silicon layer 104) to take account of the fact that semiconductor materials normally contain at least some internal or surface defects either inherently or purposely added, such as lattice defects or a few grain boundaries. The term substantially also reflects the fact that certain dopants may distort or otherwise affect the crystal structure of the semiconductor material.

The transparent substrate 102 should be formed from a material that can withstand the aforementioned temperature at which the GaN layer 106 is grown, e.g., about 750° C. or higher, more particularly about 100° C. or higher, and the CTE of the transparent substrate 102 should be close to that of GaN to avoid cracking of the GaN based layers during thermal cycling. By way of example, the transparent substrate 102 may be formed from a material selected from the group consisting of: glass, glass-ceramic, and transparent ceramics including aluminum oxynitride, magnesium aluminate spinel, yttrium aluminate garnet, polycrystalline alumina, and sapphire.

The transparent substrate 102 is preferably formed an oxide glass or an oxide glass-ceramic. Glass-ceramics are certain glasses which have been subjected to a controlled crystallization process, resulting in a homogeneous crystal/glass material and thereby yielding properties often not obtainable in glass. As between oxide glasses and oxide glass-ceramics, glass-ceramics have the advantage of being more refractory, that is, compatible with higher temperature processing. The transparent glass and glass-ceramic substrates will be referred to as "glass" from here on. By way of example, the transparent substrate 102 may be formed from glass substrates containing alkaline-earth ions, such as, CORNING INCORPORATED GLASS COMPOSITION NO. 9664. This glass-ceramic has a thermal expansion coefficient similar to silicon and thus would be a good candidate for implementing the transparent substrate 102.

The transparent substrate 102 may have a thickness in the range of about 0.1 mm to about 10 mm, such as in the range of about 0.5 mm to about 3 mm. For some applications, transparent substrates 102 having a thickness greater than or equal to about 1 micron are desirable, e.g., to avoid parasitic capacitive effects which arise when some semiconductor configurations operate at high frequencies.

In general, the transparent substrate 102 should be thick enough to support the silicon layer 104 through whatever bonding process is employed, as well as subsequent processing performed on the SOG structure to produce the LED 100. Although there is no theoretical upper limit on the thickness of the transparent substrate 102, a thickness beyond that needed for the support function or that desired for the ultimate LED structure 100 (or other semiconductor structure) might not be advantageous since the greater the thickness of the transparent substrate 102, the more difficult it might be to accomplish at least some of the process steps in forming the LED structure 100, the more expensive it might be to make it and the more weight and volume it might add to the final devices.

For certain applications, e.g., display applications, the transparent substrate 102 may be transparent in the visible, near UV, and/or near IR wavelength ranges, e.g., in the 350 nm to 2 um wavelength range.

Figure 2:
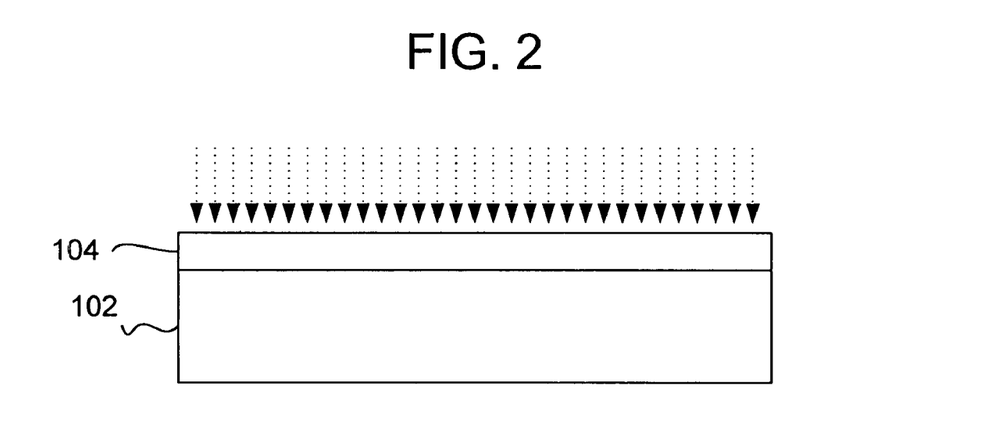
FIGS. 2-3 are block diagrams illustrating intermediate structures formed using processes of the present invention to produce the LED device of FIG. 1.
Figure 3:
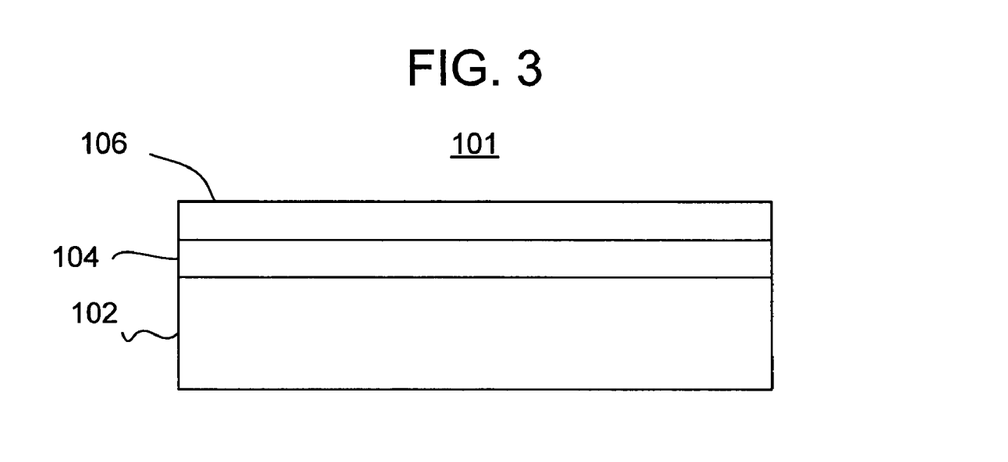

With reference to FIGS. 2-3, intermediate structures are illustrated that may be formed in order to produce a base structure 101 (FIG. 3), with which the LED 100 may be formed. With reference to FIG. 2, a semiconductor structure is formed by bonding the single crystal silicon layer 104 to the transparent substrate 102 using any technique that produces a strong bond, i.e., one that can withstand post processing temperatures and atmospheres discussed herein. Next, the GaN layer 106 is grown or deposited (as illustrated by the dashed arrows) on the single crystal silicon layer 104. This growth process may be achieved using one or more of the following processes: organo-metallic vapor phase epitaxy, metal organic chemical vapor deposition, molecular beam epitaxy, and hydride vapor phase epitaxy. These growth processes are preferably carried out at an elevated temperature, such as about 750° C. or higher, and more particularly, about 1000° C. or higher.

Pulsed laser, deposition may also be employed to deposit the GaN layer 106 on the single crystal silicon layer 104.

Pulsed laser deposition can be performed at much lower temperatures, such as from about room temperature (e.g., about 25° C.) to about 600-700° C.—and it may be possible to obtain good quality GaN even at the substantially lower temperatures.

The resulting semiconductor structure 101 (FIG. 3) includes: the transparent substrate 102; the single crystal silicon layer 104 bonded to the transparent substrate 102; and the single crystal gallium nitride layer 106 grown on the single crystal silicon layer 104. As mentioned above, the transparent substrate 102 and the single crystal silicon layer 104 bonded thereto are capable of withstanding the processing temperature of about 750° C. or higher, or about 1000° C. or higher, and are capable of withstanding the gaseous atmosphere used in the growth of the GaN based materials using the techniques described herein. The LEDs are fabricated on or within the GaN layer 106 using standard processing techniques.

Figure 4:
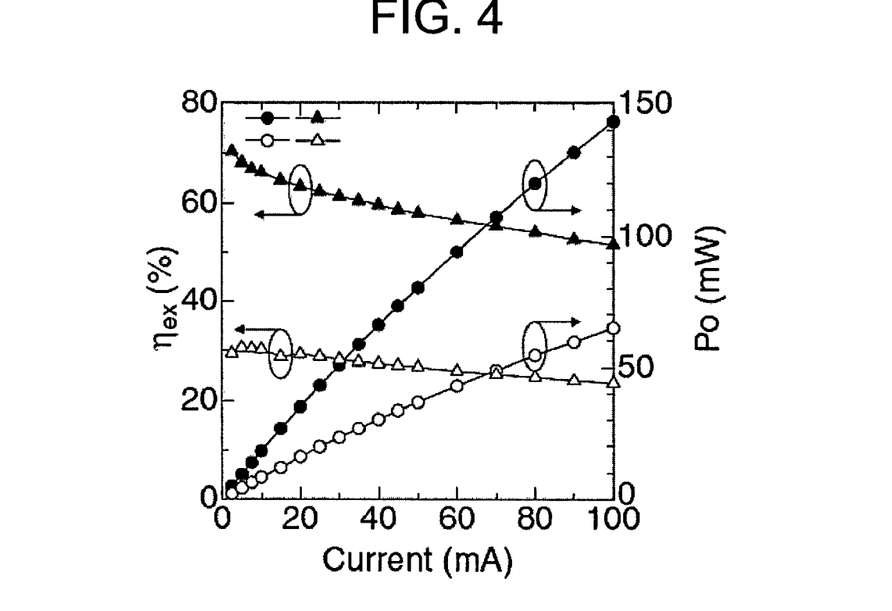
FIGS. 4-5 are graphs illustrating the known relationships between external quantum efficiency of an LED of a given area as a function of current.
Figure 5:
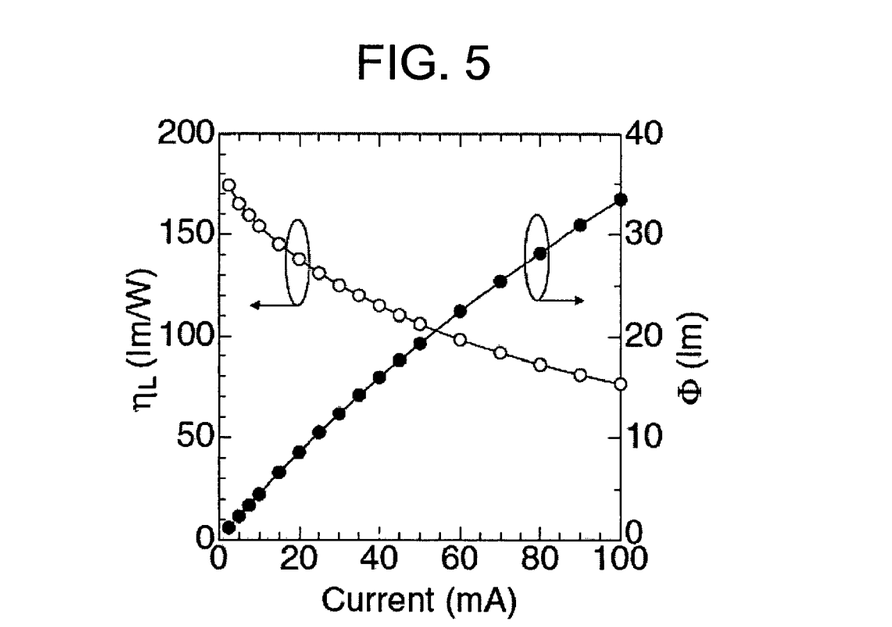

The single crystal silicon layer 104 should be of a (1 1 1) orientation or any other orientation that favors the single crystal GaN growth. Indeed, the single crystal silicon layer 104 acts as a seed layer on which the single crystal gallium nitride layer 106 is grown. The (1 1 1) orientation of the single crystal silicon layer 104 ensures that the resulting GaN layer 106 is of a sufficiently single crystal configuration (minimizing any amorphous or fine grained polycrystalline GaN), which results in improved efficiency at least when the structure 101 is employed in an LED device. In this regard, reference is made to FIGS. 4-5, which illustrate known curves for LED external quantum efficiency of blue LEDs of a given 0.1 square mm area. In general, the LED external quantum efficiency decreases with the increased current density as shown in FIGS. 4-5 (which have been published, Y. Narukawa, et al, JJAP, Vol. 45, No. 41, pp. L1084-L1086 (2006)). To keep the external quantum efficiency high, the operating current density of the LED 100 should be as low as possible. This is achieved by ensuring that the resulting GaN layer 106 is of a sufficiently single crystal configuration (minimizing any amorphous or fine grained polycrystalline GaN).

Absorption loss and light trapping in the single crystal silicon layer 104 is avoided by making the single crystal silicon layer 104 relatively thin (e.g., less than about 50 nm). In addition, single crystal silicon layer 104 has: (i) a waveguide cut off thickness of about 460 nm, and 134 nm and 378 nm for TE and TM modes, respectively; and (ii) an optical loss per pass at 460 nm: 18.1%, 9.5%, 4.9% and 2% at 100, 50, 25 and 10 nm thickness, respectively.

The single crystal silicon layer 104 may be about 1-130 nm thick, again, with less than about 50 nm being desirable for minimizing absorption loss and light trapping.

Any process for bonding the single crystal silicon layer 104 to the transparent substrate 102 may be used so long as the resulting bond is strong enough to withstand the post processing temperatures and atmospheres discussed above, e.g., in connection with growing or depositing the GaN layer 106.

A suitable bonding process will now be described with reference to FIGS. 6-8, in which intermediate structures are illustrated that may be formed in order to produce the single crystal silicon layer 104 bonded to the transparent layer 102. In this regard, the transparent substrate 102 is assumed to be a glass or glass-ceramic substrate 102 and is referred to as such. The bonding process is described in detail in U.S. Pat. No. 7,176,528, the entire disclosure of which is hereby incorporated by reference. The basic steps in the bonding process include: (i) exposing a silicon donor wafer surface to hydrogen ion implantation to create a bonding surface; (ii) bringing the bonding surface into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer.

Figure 6:
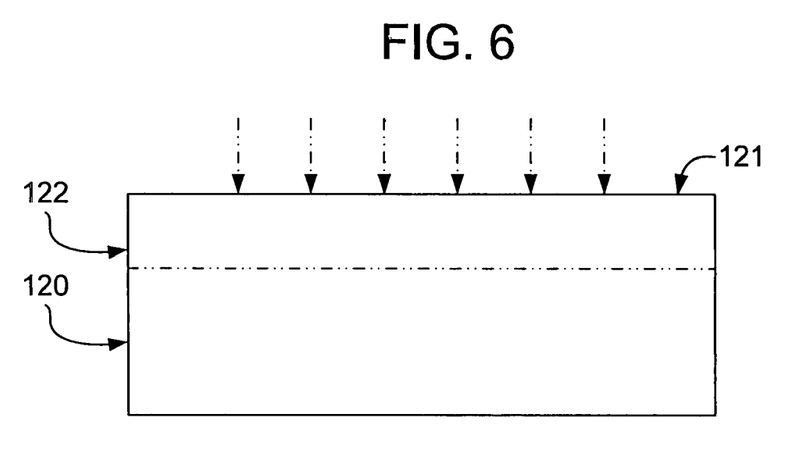
FIGS. 6-8 are block diagrams illustrating intermediate structures formed using processes of the present invention to produce a semiconductor on insulator structure suitable for use in fabricating the intermediate structure of FIG. 3.

Turning first to FIG. 6, an implantation surface 121 of a donor semiconductor wafer 120 (e.g., single crystal silicon) is prepared, such as by polishing, cleaning, etc. to produce a relatively flat and uniform implantation surface 121 suitable for bonding to the glass or glass-ceramic substrate 102. For the purposes of discussion, the semiconductor wafer 120 is a substantially single crystal silicon wafer. An exfoliation layer 122 is created by subjecting the implantation surface 121 to one or more ion implantation processes to create a weakened region below the implantation surface 121 of the donor semiconductor wafer 120. Although there is no limit to any particular method of forming the exfoliation layer 122, one suitable method dictates that the implantation surface 121 of the donor semiconductor wafer 120 may be subject to a hydrogen ion implantation process to at least initiate the creation of the exfoliation layer 122 in the donor semiconductor wafer 120. The implantation energy may be adjusted using conventional techniques to achieve a general thickness of the exfoliation layer 122, such as between about 300-500 nm.

The donor semiconductor wafer 120 may be treated to reduce, for example, the hydrogen ion concentration on the implantation surface 121. For example, the donor semiconductor wafer 120 may be washed and cleaned and the implantation donor surface 121 of the exfoliation layer 122 may be subject to mild oxidation.

Figure 7:
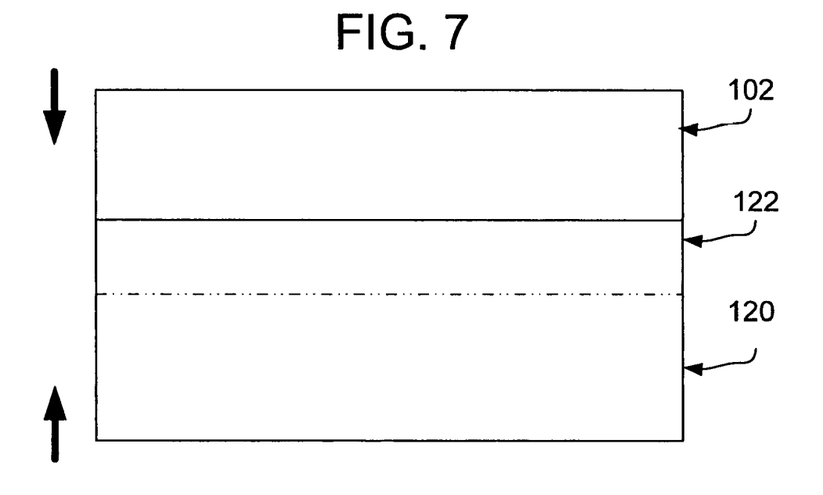
Figure 8:
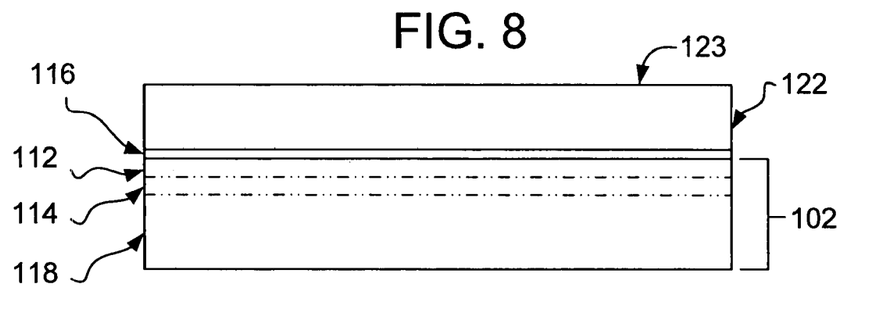

With reference to FIGS. 7-8 the glass substrate 102 may be bonded to the exfoliation layer 122 using an electrolysis process. In the bonding process, appropriate surface cleaning of the glass substrate 102 (and the exfoliation layer 122 if not done already) may be carried out. Thereafter, the intermediate structures are brought into direct or indirect contact to achieve the arrangement schematically illustrated in FIG. 7. Prior to or after the contact, the structure(s) comprising the donor semiconductor wafer 120, the exfoliation layer 122, and the glass substrate 102 are heated under a differential temperature gradient. The glass substrate 102 may be heated to a higher temperature than the donor semiconductor wafer 120 and exfoliation layer 122. By way of example, the temperature difference between the glass substrate 102 and the donor semiconductor wafer 120 (and the exfoliation later 122) is at least 1 degree C., although the difference may be as high as about 100 to about 150 degrees C. This temperature differential is desirable for a glass having a coefficient of thermal expansion (CTE) matched to that of the donor semiconductor wafer 120 (such as matched to the CTE of silicon) since it facilitates later separation of the exfoliation layer 122 from the semiconductor wafer 120 due to thermal stresses.

Once the temperature differential between the glass substrate 102 and the donor semiconductor wafer 120 is stabilized, mechanical pressure is applied to the intermediate assembly. The pressure range may be between about 1 to about 50 psi. Application of higher pressures, e.g., pressures above 100 psi, might cause breakage of the glass substrate 102.

The glass substrate 102 and the donor semiconductor wafer 120 may be taken to a temperature within about +/−150 degrees C. of the strain point of the glass substrate 102.

Next, a voltage is applied across the intermediate assembly, for example with the donor semiconductor wafer 120 at the positive electrode and the glass substrate 102 the negative electrode. The intermediate assembly is held under the above conditions for some time (e.g., approximately 1 hour or less), the voltage is removed and the intermediate assembly is allowed to cool to room temperature.

With reference to FIG. 8, the donor semiconductor wafer 120 and the glass substrate 102 are then separated, which may include some peeling if they have not already become completely free, to obtain a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

The application of the voltage potential causes alkali or alkaline earth ions in the glass substrate 102 to move away from the semiconductor/glass interface further into the glass substrate 102. More particularly, positive ions of the glass substrate 102, including substantially all modifier positive ions, migrate away from the higher voltage potential of the semiconductor/glass interface, forming: (1) a reduced positive ion concentration layer 112 in the glass substrate 102 adjacent the semiconductor/glass interface; and (2) an enhanced positive ion concentration layer 112 of the glass substrate 102 adjacent the reduced positive ion concentration layer 112. This accomplishes a number of functions: (i) an alkali or alkaline earth ion free interface (or layer) 112 is created in the glass substrate 102; (ii) an alkali or alkaline earth ion enhanced interface (or layer) 114 is created in the glass substrate 102; (iii) an oxide layer 116 is created between the exfoliation layer 122 and the glass substrate 102; and (iv) the glass substrate 102 becomes very reactive and bonds to the exfoliation layer 122 strongly with the application of heat at relatively low temperatures.

In the example illustrated in FIG. 8, the intermediate structure resulting from the electrolysis process includes, in order: a bulk glass substrate 118 (in the glass substrate 102); the enhanced alkali or alkaline earth ion layer 114 (in the glass substrate 102); the reduced alkali or alkaline earth ion layer 112 (in the glass substrate 102); the oxide layer 116; and the exfoliation layer 122.

It has been found that the positive ion depletion layer 112 once formed is stable over time even if the structure is heated to an elevated temperature comparable to, or even to some extent higher than, that used in the electrolysis process—e.g., the aforementioned temperatures at which the GaN layer 106 is applied to the single crystal silicon layer 106. Having been formed at an elevated temperature, the positive ion depletion layer 112 is especially stable, even at elevated temperatures. These considerations ensure that alkali and alkaline-earth ions will not diffuse back from the oxide glass or oxide glass-ceramic 102 into the single crystal silicon layer 104. This minimizes any distortion in the crystal structure of the single crystal silicon layer 104 and minimizes imperfections in the GaN layer 106 formed thereon.

Figure 9:
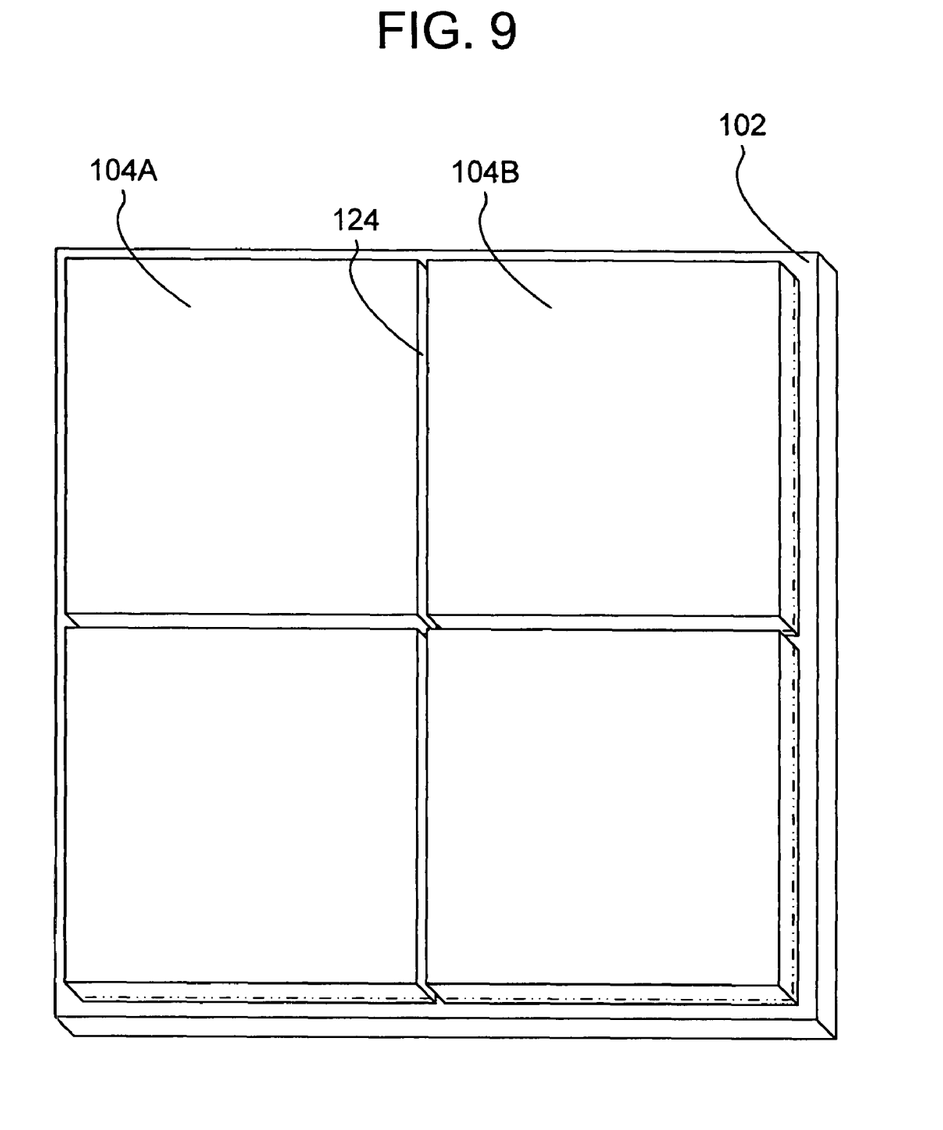
FIGS. 9-11 are block diagrams illustrating intermediate structures formed using processes of the present invention to produce a large area intermediate semiconductor on insulator structure of FIG. 3.
Figure 10:
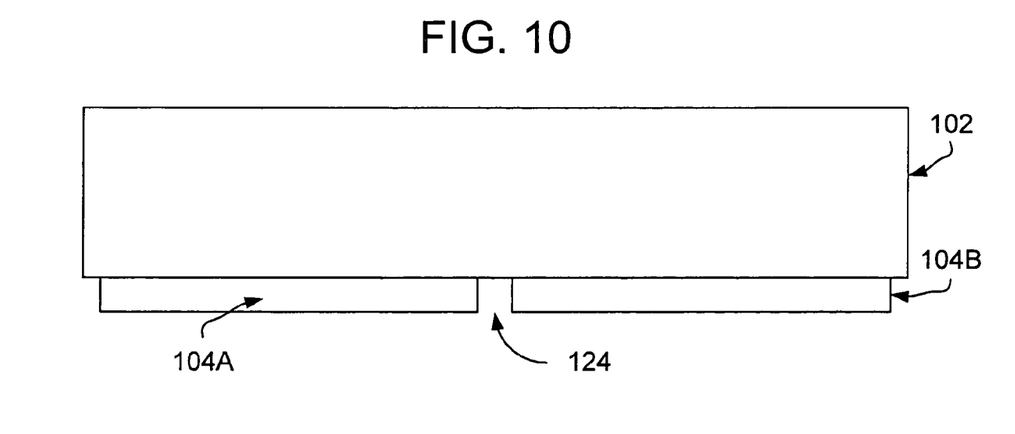
Figure 11:
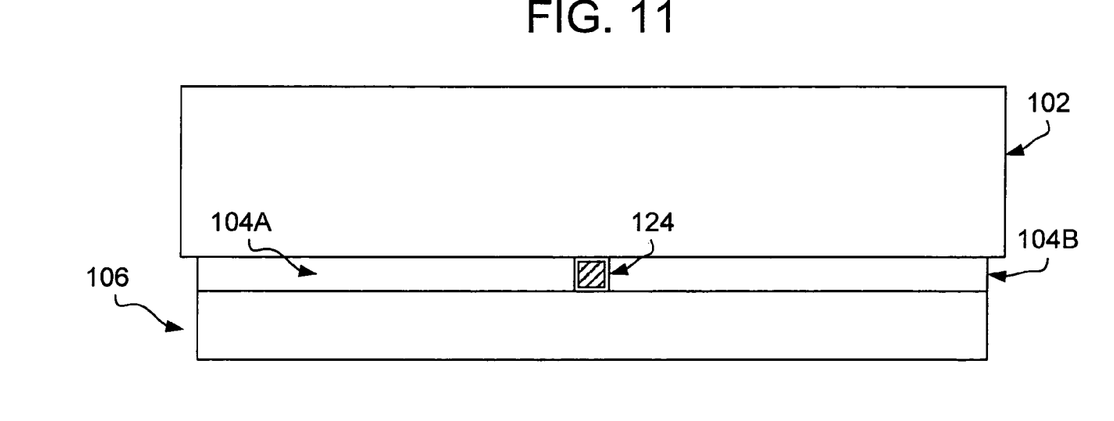

With reference to FIGS. 9-11, in order to reduce the dislocation density in the GaN layer 106, it may be beneficial to deposit the GaN layer 106 on a single crystal silicon layer 104 formed from separate tiles 104A, 104B, etc. having seams 124 therebetween (FIGS. 9-10). With reference to FIGS. 10-11, the single crystal gallium nitride layer 106 may grow through lateral epitaxy in the seams 124 to result in a single, integrated layer 106. This advantage in lateral growth is most pronounced when the size of the single crystal silicon tiles 104A, 104B are relatively small compared to the size of the GaN layer 106. In one or more embodiments, a plurality of small (e.g., micron-size) islands of single crystal silicon tiles 104A, 104B, etc. may be employed, on which the GaN will grow through lateral epitaxy, resulting in substantial reduction in any dislocations in the GaN.

The above approaches for forming the structures 100, 101, may be used to produce relatively large area LED devices. Among the benefits of a large area device is easy heating sink application. Since the single crystal silicon layer 104 on the transparent substrate 102 (particularly a glass substrate) has the potential to be cheaper and larger than, for example, sapphire or SiC, larger area structures may be used to improve the external efficiency. To generate 1000 lm (comparable to a 60 W incandescent light bulb), one must supply 5.88 W of electrical power (assuming an external quantum efficiency of 170 lm/W at 25 mA/mm$^2$). About 30% of the electrical power input produces heat, about 1.75 W in this example. The LED area is about 75 mm$^2$ (5.88 W/3.13 V/25 MA/mm$^2$) which is about 75 times larger than a typical high power LED. The larger area; however, makes it easier and simpler to air cool the LED structure.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
   a transparent substrate including, in order: a first surface, a bulk layer formed from a material selected from the group consisting of glass, glass ceramic, and transparent ceramics, a layer formed of non-ceramic glass, and a second surface;
   a single crystal silicon layer bonded to the second surface of the transparent substrate; and
   a single crystal gallium nitride layer grown on the single crystal silicon layer,
   wherein the transparent substrate and the single crystal silicon layer bonded thereto are capable of withstanding a processing temperature of 1000° C. or higher for growing the single crystal gallium nitride layer on the single crystal silicon layer.

2. The apparatus of claim 1, wherein the single crystal silicon layer is directly bonded to the second surface of the transparent substrate.

3. The apparatus of claim 1, wherein the single crystal silicon layer is of a 1,1,1 orientation.

4. The apparatus of claim 1, wherein the single crystal silicon layer is about 1-100 nm thick.

5. The apparatus of claim 1, wherein the single crystal silicon layer is formed from separate tiles having seams therebetween in which single crystal gallium nitride has grown.

6. A semiconductor on insulator substrate comprising:
   a transparent substrate formed of glass or glass ceramic and includes, in order, a first surface, a bulk layer, an enhanced positive ion concentration layer, a reduced positive ion concentration layer that is formed of a non-ceramic glass, a second surface, where the enhanced positive ion concentration layer contains substantially all modifier positive ions from the reduced positive ion concentration layer as a result of ion migration;
   a single crystal silicon layer directly bonded to the second surface of the transparent substrate;
   a conductive or semiconductive oxide layer located between the second surface of the substrate and the single crystal silicon layer; and a single crystal gallium nitride layer on the single crystal silicon layer wherein the transparent substrate and the single crystal silicon layer bonded thereto are capable of withstanding a processing temperature of 1000° C. or higher for growing the single crystal gallium nitride layer on the single crystal silicon layer.

7. The semiconductor on insulator substrate of claim 6, wherein the single crystal silicon layer is directly bonded to the second surface of the transparent substrate.

8. An LED structure, comprising:

a transparent substrate including, in order: a first surface, a bulk layer formed from a material selected from the group consisting of glass, glass ceramic, and transparent ceramics, a layer formed of non-ceramic glass, and a second surface;

a single crystal silicon layer directly bonded to the second surface of the transparent substrate; and a single crystal gallium nitride layer grown on the single crystal silicon layer, wherein the gallium nitride layer includes an n-doped layer and a p-doped layer forming an LED wherein the transparent substrate and the single crystal silicon layer bonded thereto are capable of withstanding a processing temperature of 1000° C. or higher for growing the single crystal gallium nitride layer on the single crystal silicon layer.

9. The LED of claim 8, wherein the single crystal silicon layer is directly bonded to the second surface of the transparent substrate.

* * * * *